United States Patent
Sabbione et al.

(10) Patent No.: US 9,064,783 B2
(45) Date of Patent: Jun. 23, 2015

(54) METHOD FOR THE DIRECT BONDING OF A SILICON OXIDE LAYER

(71) Applicant: COMMISSARIAT A L'ENERGIE ATOMIQUE ET AUX ENE ALT, Paris (FR)

(72) Inventors: Chiara Sabbione, Grenoble (FR); Lea Di Cioccio, Saint Ismier (FR); Jean-Pierre Nieto, La Rochette (FR); Laurent Vandroux, Le Cheylas (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/354,402

(22) PCT Filed: Oct. 24, 2012

(86) PCT No.: PCT/EP2012/071062
§ 371 (c)(1),
(2) Date: Apr. 25, 2014

(87) PCT Pub. No.: WO2013/060726
PCT Pub. Date: May 2, 2013

(65) Prior Publication Data
US 2014/0342528 A1    Nov. 20, 2014

(30) Foreign Application Priority Data
Oct. 26, 2011   (FR) .................................. 11 59723

(51) Int. Cl.
*H01L 21/30* (2006.01)
*H01L 21/46* (2006.01)
(Continued)

(52) U.S. Cl.
CPC .......... *H01L 21/187* (2013.01); *H01L 21/2007* (2013.01); *H01L 21/76251* (2013.01);
(Continued)

(58) Field of Classification Search
CPC ................... H01L 21/02164; H01L 21/02216; H01L 21/02255; H01L 21/02274; H01L 21/02359; H01L 21/187; H01L 21/28185; H01L 21/2007; H01L 21/31051
USPC ......... 438/118, 121, 125, 406, 455, 761, 762, 438/778, 787, 974, FOR. 395; 148/DIG. 12
See application file for complete search history.

(56) References Cited

U.S. PATENT DOCUMENTS

| 5,383,993 A | 1/1995 | Katada et al. |
| 2008/0268617 A1 | 10/2008 | Thakur et al. |

(Continued)

FOREIGN PATENT DOCUMENTS

WO    2008 021747    2/2008

OTHER PUBLICATIONS

International Search Report Issued Jan. 18, 2013 in PCT/EP12/071062 Filed Oct. 24, 2012.

(Continued)

*Primary Examiner* — Kyoung Lee
*Assistant Examiner* — Joannie A Garcia
(74) *Attorney, Agent, or Firm* — Oblon, McClelland, Maier & Neustadt, L.L.P.

(57) ABSTRACT

A direct bonding method between at least a first layer (104) comprising silicon oxide having a thickness equal to or higher than about 10 nm and a second layer (108) of material having hydrophilicity, comprising at least the steps of:
making the first layer (104) on a first substrate (102) such that the absorbance value of this first layer (104), at a vibration frequency of silanol bonds present in the first layer (104) equal to about 3660 cm$^{-1}$, is equal to or higher than about $1.5 \times 10^{-5}$ nm$^{-1}$, the silanol bonds being formed in at least part of the thickness of the first layer (104) which is equal to or higher than about 10 nm;
direct bonding between the first layer (104) and the second layer (108).

11 Claims, 3 Drawing Sheets

(51) Int. Cl.
*H01L 21/18* (2006.01)
*H01L 21/20* (2006.01)
*H01L 21/762* (2006.01)
*H01L 21/02* (2006.01)
*H01L 21/3105* (2006.01)

(52) U.S. Cl.
CPC .... *H01L21/02126* (2013.01); *H01L 21/02274* (2013.01); *H01L 21/3105* (2013.01); *H01L 21/02164* (2013.01); *H01L 21/02304* (2013.01); *H01L 21/02359* (2013.01); *H01L 21/31051* (2013.01)

(56) References Cited

U.S. PATENT DOCUMENTS

2012/0132263 A1* 5/2012 Herbots et al. ............... 136/252
2014/0295642 A1* 10/2014 Fournel et al. ............... 438/458

OTHER PUBLICATIONS

U.S. Appl. No. 14/221,402, filed Mar. 21, 2014, Berthier, et al.
U.S. Appl. No. 14/353,883, filed Apr. 24, 2014, Moriceau, et al.
French Preliminary Search Report issued Aug. 2, 2012 in Patent Application No. 1159723 (with English translation of categories of cited documents).
Gweltaz Gaudin, et al., "Low temperature direct wafer to wafer bonding for 3D integration", 3D Systems Integration Conference (3DIC), IEEE International, 2010, 4 Pages.
Benoit Olbrechts, et al., "PECVD oxide as intermediate film for wafer bonding: Impact of residual stress", Microelectronic Engineering, vol. 87, 2010, pp. 2178-2186.
F. Rieutord, et al., "Rough surface adhesion mechanisms for wafer bonding", ECS Trans. vol. 3, 2006, 10 Pages.
A.N.R. da Silva, et al., "Tetraethylorthosilicate SiO2 films deposited at a low temperature", Microelectronics Reliability, vol. 40, 2000, pp. 621-624.
C. Ventosa, et al., "Hydrophilic low-temperature direct wafer bonding", Journal of Applied Physics, vol. 104, 2008, pp. 123524-1-123524-6.
M. Wiegand, et al., "Wafer bonding of silicon wafers covered with various surface layers", Sensors and Actuators, vol. 86, 2000, pp. 91-95.
U.S. Appl. No. 14/504,701, filed Oct. 2, 2014, Di Cioccio, et al.

* cited by examiner

METHOD FOR THE DIRECT BONDING OF A SILICON OXIDE LAYER

TECHNICAL FIELD

This invention relates to a direct bonding method between at least one first layer comprising silicon oxide and a second layer of material having hydrophilicity. The invention allows for example to secure two substrates on which the first layer of silicon oxide and the second layer of material are made, with a great bonding energy.

STATE OF PRIOR ART

The direct bonding, also called molecular bonding or molecular adhesion bonding, consists in securing two surfaces of material one against the other without an intermediate adhesive layer between these two surfaces. In this type of bonding, adhesion is achieved because of the fact that the surfaces to be bonded are smooth enough (typically comprising a roughness lower than 6 nm RMS), free of particles and/or contaminations, and moved closer to each other such that attractive forces of electronic interaction between atoms or molecules of both surfaces to be bonded are created, for example, Van der Waals forces, at ambient temperature and pressure.

Such a direct bonding is used in numerous applications to secure two elements comprising in particular oxide layers deposited on those elements. A direct bonding is a hydrophilic type bonding because it ensures adhesion of hydrophilic surfaces between each other, that is surfaces having the ability to bind with water (through an adsorption mechanism).

When two elements, for example substrates comprising semiconductor, to be secured to each other, have surface topologies, it is possible to deposit oxide layers onto these topologies, and then to conduct a planarization of the deposited oxides. In this way, planar surfaces can be obtained, the topology of which has been smoothed, able to be bonded against each other through direct bonding.

Moreover, the elements to be secured may happen to be already covered with an oxide, nitride or oxinitride layer. In this case, it is interesting to be able to make the bonding from these layers because it is sometimes impossible or too expensive to remove these layers.

The oxide layers used for such a direct bonding can be obtained through depositions of silicon oxide of PECVD (plasma-enhanced chemical vapour deposition) type implemented at relatively low temperatures, generally lower than about 400° C., in order not to damage components, interconnections or even depositions of other materials, made on the elements to be secured.

However, depending on the conditions under which the oxide layers have been made, as well as the equipments and elements used, the oxide layers can have different bonding energies.

After bonding, the secured substrates can be subjected to a heat treatment also implemented at a relatively low temperature (for example, lower than about 400° C.), to avoid any damage of the elements formed on the substrates. Such a heat treatment enables the bonding energy obtained to be increased. However, this heat treatment performed after bonding may result in the formation of defects at the interfaces between the oxide and semiconductor. In order to prevent these defects from being formed, the only known technique consists in densifying the oxide layers by another heat treatment performed before bonding.

However, the addition of such heat treatment implemented before the bonding method represents a drawback in terms of costs, duration, etc.

DISCLOSURE OF THE INVENTION

One object of the present invention is to provide a direct bonding method between at least one first layer comprising silicon oxide and a second layer of a material having hydrophilicity, enabling a high bonding energy to be obtained between both layers and avoiding the formation of subsequent defects in the structure obtained, for example during a heat treatment performed after bonding, without having to perform a specific heat treatment to densify the first layer and the second layer.

For this, the present invention provides a direct bonding method between at least a first layer comprising silicon oxide and a second layer of a material having hydrophilicity, comprising at least the steps of:

making the first layer onto a first substrate such that the absorbance value of this first layer, at a vibration frequency of silanol bonds present in the first layer, is equal to or higher than about $1.5 \times 10^{-5}$ nm$^{-1}$;

direct bonding between the first layer and the second layer.

The term "hydrophilicity" means that the contact angle of a drop is preferably lower than about 5°.

By making the first layer comprising silicon oxide such that it has such an absorbance (including a peak having a value equal to or higher than $1.5 \times 10^{-5}$ nm$^{-1}$ at a vibration frequency of silanol bonds present in the first layer), this means that some silanol bonds (Si—OH bonds) have been formed in the first layer of silicon oxide, that is in its thickness and not only at the surface of this first layer. Relatively to a standard layer of silicon oxide ($SiO_2$ or $SiO_x$ with x close to 2) not having silanol bonds, the first layer which include such a density, or rate, of silanol bonds, has a strong tendency to absorb moisture. But, the presence of —OH groups and $H_2O$ molecules incorporated in silicon oxide upon making and absorbed by the environment affect the physical and mechanical properties of the material. In particular, this results in a decrease in hardness and Young modulus of this material relative to standardly deposited layers. But, this decrease in hardness results in an increase in the bonding energy obtained. Thus, it will become possible to obtain bonding energies that can be for example higher than about 3 J/m$^2$.

The absorbance value is expressed here in nm$^{-1}$, that is the absorbance measured is relative to the thickness of the layer the absorbance of which is measured.

The vibration frequency of the silanol bonds is equal to about 3660 cm$^{-1}$.

The first layer of silicon oxide has a thickness equal to or higher than about 10 nm. Furthermore, the silanol bonds are formed in at least part of the thickness of the first layer which is equal to or higher than about 10 nm, that is in a thickness of silicon oxide higher than or equal to about 10 nm, that is from the surface of the first layer down to a depth equal to or higher than about 10 nm. This thickness within which the silanol bonds are made may also be higher than about 10 nm, or equal to or higher than about 20 nm, or equal to or higher than about 50 nm, or even equal to or higher than about 100 nm. It is for example possible that the silanol bonds are made throughout the entire thickness of the first layer of silicon oxide.

Making the first layer may include at least one deposition of the PECVD (plasma enhanced chemical vapour deposition) type of silicon oxide onto the first substrate. The first substrate may comprise silicon.

The first layer may be deposited such that it has, just after deposition, a tensile stress equal to or higher than about 50 MPa.

The first layer may comprise non-stoichiometric silicon oxide obtained via a PECVD deposition during which a depositing reactor is used at a RF power lower than a RF power enabling silicon dioxide to be deposited in its stoichiometric form $SiO_2$, or closest to its stoichiometric form $SiO_2$, forming at least part of silanol bonds present in the first layer. Thus, the formation of silanol bonds in the first layer of silicon oxide is at least partly achieved by lowering the RF power of the depositing reactor used relative to a standard $SiO_2$ deposition.

The first layer may comprise non-stoichiometric silicon oxide obtained via PECVD deposition implemented from gas precursors of a first type (for example, TEOS (TetraEthOxiSilane), or silane, or $Si_xH_y$, or even $SiF_4$) and oxidizing gas precursors (for example $O_2$) the ratio of which, that is the ratio of the amount of precursors of the first type to the amount of oxidizing precursors, is higher than that enabling silicon dioxide to be deposited in a stoichiometric form or close to its stoichiometric form, forming at least part of silanol bonds present in the first layer. Thus, without changing the RF power with respect to a conventional $SiO_2$ deposition, it is possible to form silanol bonds in the layer of silicon oxide deposited by varying the ratio of the amounts of gas precursors involved upon deposition, thus changing the amount of radicals in the plasma created upon deposition.

Alternatively, it is possible to change both the ratio between the gas precursors involved upon deposition and decrease the RF power of the reactor used to create silanol bonds in the silicon oxide deposited.

Making the first layer may include depositing silicon oxide onto the first substrate, and then a step of hydrolysing the silicon oxide deposited forming at least part of the silanol bonds present in the first layer.

In this case, it is possible to first deposit a standard $SiO_2$ layer not including silanol bonds, or a layer of silicon oxide including few silanol bonds, and then to conduct a hydrolization of this layer in order to achieve a desired density of silanol bonds in the layer.

The density of silanol bonds in the first layer of silicon oxide is not necessarily constant throughout the thickness of this first layer of silicon oxide wherein these bonds are formed. For example, when the first layer of silicon oxide is made via the implementation of a hydrolyzation step, it is possible that the density of silanol bonds in this layer forms a gradient as a function of the depth at which the silanol bonds are located, that is the deeper the silanol bonds are located, the lower the density of these silanol bonds at this depth.

Techniques other than PECVD deposition or hydrolyzation may be implemented to make a layer of silicon oxide comprising silanol bonds such that the absorbance value of this layer, at a vibration frequency of the silanol bonds present in the layer, is equal to or higher than about $1.5 \times 10^{-5}$ nm$^{-1}$.

The method may further include, after the direct bonding between the first layer and the second layer, a step of annealing the first layer and the second layer at a temperature equal to or lower than about 400° C., for example between about 200° C. and 400° C., for a period of time between about 10 minutes and 10 hours, for example equal to 2 hours. Thus, the bonding energy is increased between the two layers secured against each other.

The method may further include, between making the first layer onto the first substrate and the direct bonding between the first layer and the second layer, a step of chemical mechanical planarization of the first layer and/or the second layer. This planarization enables the roughness to be reduced and the hydrophilic behaviour of the faces of the first layer and the second layer intended to be secured one against the other to be improved, and thus the bonding energy obtained between these two layers to be increased.

When the first layer is directly deposited onto the first substrate comprising silicon, the first layer may be made such that its absorbance value at the vibration frequency of the silanol bonds present in the first layer is between about $1.5 \times 10^{-5}$ nm$^{-1}$ and $2 \times 10^{-5}$ nm$^{-1}$. Thus, by not exceeding an absorbance of $2 \times 10^{-5}$ nm$^{-1}$ at the vibration frequency of the silanol bonds when the first layer of silicon oxide is directly deposited onto the first substrate, the subsequent formation of defects is thus avoided, for example upon implementing an annealing, at the interface between the first layer and the first substrate, wherein these defects can weaken the mechanical connection between the first layer of silicon oxide and the first substrate.

When the first layer is deposited on a barrier layer covering the first substrate and comprising at least one material able to block the water diffusion from the first layer to the first substrate, the first layer may be made such that its absorbance value at the vibration frequency of the silanol bonds present in the first layer is higher than about $2 \times 10^{-5}$ nm$^{-1}$. When the first layer of silicon oxide is not directly deposited onto the first substrate, but on a barrier layer (for example comprising nitride, thermal oxide, metal, etc.) formed beforehand on the first substrate, it is in this case possible and advantageous to maximize the density of silanol bonds in the first layer in order to increase the bonding energy as much as possible.

The second layer of material may comprise silicon oxide and be made analogously to the first layer. All the characteristics previously described for the first layer may also be applicable to the second layer.

Alternatively, the second layer may be the surface layer of a semiconductor or glass or quartz or silica substrate.

BRIEF DESCRIPTION OF THE DRAWINGS

The present invention will be better understood upon reading the description of exemplary embodiments given by way of indicating purposes and in no way limiting in reference to the appended drawings wherein.

Identical, similar or equivalent parts of the different figures described hereinafter bear the same reference numerals so as to facilitate switching from one figure to the other.

The different parts shown in the figures are not necessarily drawn at an uniform scale, to make the figures more legible.

The different possibilities (alternative embodiments) should be understood as being non-mutually exclusive and can be combined together.

DETAILED DISCLOSURE OF PARTICULAR EMBODIMENTS

Figure 1A:
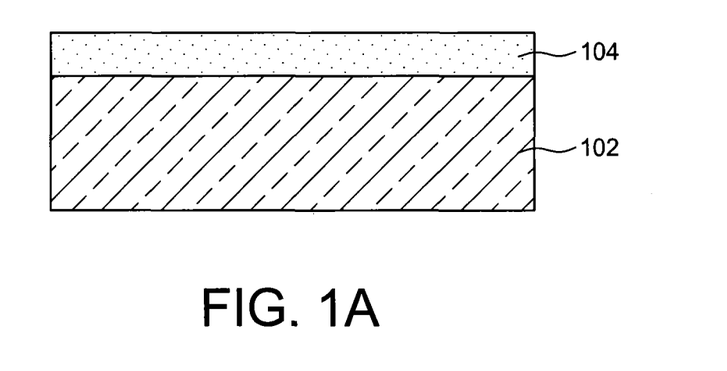
FIGS. 1A to 1C show steps of a direct bonding method between a first layer of silicon oxide and a second layer, object of the present invention, according to a particular embodiment.
Figure 1B:
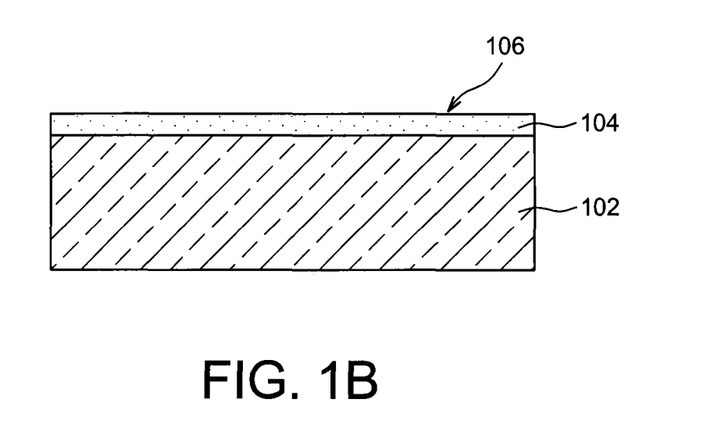
Figure 1C:
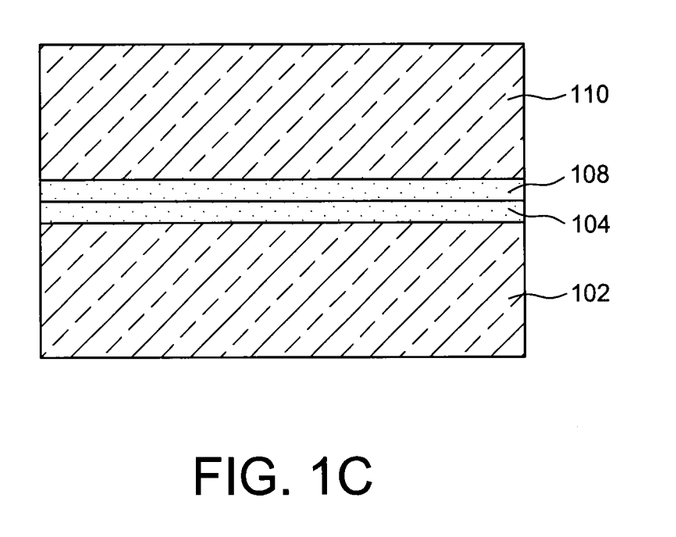

FIGS. 1A to 1C will be first referred to, which show the steps of a direct bonding method between at least one first layer comprising silicon oxide and a second layer of material having hydrophilicity, according to a particular embodiment.

As shown in FIG. 1A, first, the deposition of a first layer of silicon oxide 104 is made onto a first substrate 102 for example comprising silicon. The first layer 104 is preferably deposited through PECVD from TEOS and $O_2$ type gas precursors, but can also be obtained from other gas precursors such as for example silane $SiH_4$ or more generally compounds of the general formula $Si_xH_y$, or of silane $SiF_4$.

The first layer of silicon oxide 104 can have a thickness between about 10 nm and 25 μm, or preferably between about 12 μm and 20 μm in particular when a chip is bonded onto a wafer, or between 10 nm and 2 μm when two substrates are secured to each other. For example, a layer 104 is made having a thickness equal to about 600 nm.

In view of the deposition conditions (detailed later) of the first layer 104, the silicon oxide of this first layer 104 is not a silicon oxide in a stoichiometric form $SiO_2$. The silicon oxide of the first layer 104 is of a non-stoichiometric composition of the formula $SiO_x$, with x such that $1<x<2$. Furthermore, during the deposition, carbon and hydrogen atoms can be incorporated to the first layer 104 because of incomplete chemical reactions occurring during the deposition. The silicon oxide of the first layer 104 is then of a non-stoichiometric composition of the formula $SiO_xC_yH_z$, with x non-zero, y and z can be zero.

The first layer of silicon oxide 104 is then planarized through CMP (chemical mechanical planarization) at its front face 106 in order to improve the hydrophilic behaviour and reduce the surface roughnesses at the front face 106 of the first layer of silicon oxide 104 intended to be subsequently bonded to the second layer, thus increasing the bonding energy which will be achieved between both layers (FIG. 1B). The thickness of the layer 104 after the CMP is for example between about 10 nm and 25 μm, and for example equal to about 400 nm.

Finally, as shown in FIG. 1C, the direct bonding of the first layer of silicon oxide 104 against the second layer 108 having hydrophilicity, for example comprising silicon oxide, deposited against a second substrate 110 and for example made and processed analogously to the first layer of silicon oxide 104 (particular deposition conditions enabling silicon oxide to be obtained in a non-stoichiometric form, and then CMP) is made. A heat treatment (annealing) at a temperature between about 200° C. and 400° C., for a period of time between about 10 minutes and about 10 hours, and for example equal to 2 hours, is then implemented, completing the direct bonding between the first layer 104 and the second layer 108.

In the above described method, the first layer of silicon oxide 104 (as well as possibly the second layer of silicon oxide 108) is obtained via a PECVD deposition equipment the reactor of which is used at a low RF power, that is a RF power lower than that enabling a silicon oxide deposition in a $SiO_2$ type stoichiometric form to be made.

The deposition of the first layer of silicon oxide 104 can be made with different types of PECVD type deposition equipment. When TEOS is used as a gas precursor for depositing the first layer 104, it is for example possible to use two types of reactors which differ in the very nature of their injection system: the "parallel plate plasma discharge" type reactor of the P5000B equipment based on a direct injection, and the P5000C reactor which is of the bubbler type, both marketed by "Applied Materials" company.

Because of differences in the deposition equipments that can be used to deposit the first layer of silicon oxide 104, the RF powers applied differ as a function of the equipment used. To obtain the first layer of silicon oxide 104 using the P5000B reactor, the RF power of this reactor is for example equal to about 450 W. Using the P5000C reactor, the RF power is for example set to about 500 W.

By lowering the RF power of the PECVD deposition equipment to deposit the first layer of silicon oxide 104 with respect to a conventional deposition of $SiO_2$ in a stoichiometric form, the deposited silicon oxide is given hydrophilicity, that is a tendency to absorb moisture, thus promoting the formation of silanol bonds (Si—OH bonds) within the first layer of silicon oxide 104. The silanol bonds are in particular formed in the thickness of the layer 104, from its front face 106 to a depth equal to or higher than about 10 nm. But, the presence of these silanol bonds in the first layer of silicon oxide 104 affects the physical and mechanical properties of the material of the first layer 104. In particular, they result in an increased tensile stress (for example higher than about 50 MPa) as well as a decrease in hardness, and thus in the Young's modulus, of the material obtained relative to a standard $SiO_2$ in a stoichiometric form. This reduction in the material hardness promotes direct bonding between the layer of silicon oxide 104 and the second layer of silicon oxide 108 by virtue of a greater bonding energy achieved.

The table below gives examples of refractive indexes, permittivity and tensile stress of layers of silicon oxide deposited using P5000B and P5000C reactors with different RF powers. The layers of silicon oxide obtained with the P5000B reactor used at a RF power equal to 750 W and with the P5000C reactor used at a RF power equal to 675 W correspond to standard $SiO_2$ layers, whereas those obtained with the P5000B used at a RF power equal to 450 W and with the the P5000C reactor used at a RF power equal to 500 W correspond to layers of silicon oxide similar to the first layer 104, that is incorporating silanol bonds.

|  | Refractive index | $\epsilon_r$ | Tensile stress (MPa) |
| --- | --- | --- | --- |
| P5000B-750 W | 1.463 | 4.3 | −101 |
| P5000B-450 W | 1.452 |  | 80 |
| P5000C-675 W | 1.463 | 4.3 | −26 |
| P5000C-500 W | 1.450 |  | 80 |

The bonding at the interface between the first layer of silicon oxide 104 and the second layer of silicon oxide 108 is achieved by the interaction between asperities at microroughnesses through a friction mechanism between both layers. During the heat treatment made after both layers have been contacted with each other, the contact points at the asperities increase the contact area, that's why the bonding energy increases when the treatment temperature increases. Thus, the heat treatment is preferably made at a temperature close to the limit beyond which the elements present are degraded (back-end of the substrates 102 and 110, such as for example CMOS transistors), for example at a temperature close to 400° C.

In the bonding method described herein, the adhesion surface at the asperities is improved by a decrease in the hardness of the silicon oxide of the first layer 104 and possibly of the second layer 108. Indeed, by reducing this hardness, the tops of these asperities present on the layers 104 and 108 can be easily deformed during the heat treatment. This mechanism results in an increased bonding energy after the heat treatment. Thus, a bonding energy equal to about 1.3 J/m$^2$ is obtained for a SiO$_2$ layer deposited with the P5000B reactor used at a RF power equal to 750 W, and a bonding energy equal to about 2.4 J/m$^2$ for the first layer 104 obtained with the P5000C reactor used at a RF power equal to 450 W.

The mechanical properties of the silicon oxide obtained can be measured for example by indentation (method enabling, by depressing a tip with a force measured in the material and by measuring the trace obtained, the reduced Young's modulus of the material to be derived) and compared with those of fused silica. The table below gives examples of values of the hardness and Young's modulus of a layer of fused silica, a layer of SiO$_2$ in a stoichiometric form deposited with the P5000B reactor at a RF power equal to 750 W and a layer of silicon oxide obtained with the P5000B reactor operating at a RF power equal to 450 W.

|  | Hardness (GPa) | Young's modulus (GPa) (Poisson ratio = 0.18) |
|---|---|---|
| Fused silica | 10 | 73.2 |
| P5000B-750 W | 8.3 | 72.7 |
| P5000B-450 W | 6.6 | 60.6 |

These data show that the layer of silicon oxide deposited at a lower RF power is the one having the lowest hardness.

It is possible to predict the bonding energy which will be obtained after heat treatment by measuring the amount of —OH groups and H$_2$O molecules formed in the volume of the layer of silicon oxide before it is bonded via the study of the absorption band of the vibrational mode of the —OH groups and H$_2$O molecules through FTIR (Fourier Transform Infrared spectroscopy) spectroscopy in transmission mode. Such a spectroscopy is based on the absorption of an infrared radiation by the material analysed. It enables, via the detection of vibrations characteristic to the molecules and chemical bonds of the material, identification and a quantification of the different chemical bonds present in the material to be performed. Indeed, when the energy of an infrared light beam is close to the vibration energy of a chemical bond, the latter will absorb the radiation and it is then possible to measure the reflected or transmitted intensity, proportional to the amount of chemical bonds excited by the light beam.

In the present case, such a spectroscopy thus enables the rate, or density, of silanol bonds present in the first layer of silicon oxide 104 to be quantified. The intensity of the absorbance spectrum measured depends on the amount of silanol bonds excited in the volume of the material.

The presence of these compounds (—OH groups and H$_2$O molecules) results, in the absorbance spectrum measured, in an absorbance band in the vibration frequency range between about 3000 and 3800 cm$^{-1}$. This spectrum can be measured on a silicon oxide sample which has the same characteristics as the layer of silicon oxide the chemical properties of which are desired to be known. In this case, the sample is deposited at the same time as the layer of silicon oxide studied and the spectrum is measured just after the implementation of the planarization of the layer and the sample.

Silanol bonds (Si—OH) can be present in the material deposited either as isolated bonds, or as gathered bonds (bonded through hydrogen bondings). The isolated silanol bonds vibrate at a vibration frequency equal to about 3660 cm$^{-1}$ and form a peak on the absorbance spectrum at this frequency. The gathered silanol bonds vibrate in the vibration frequency range of 3200-3600 cm$^{-1}$.

Figure 2:
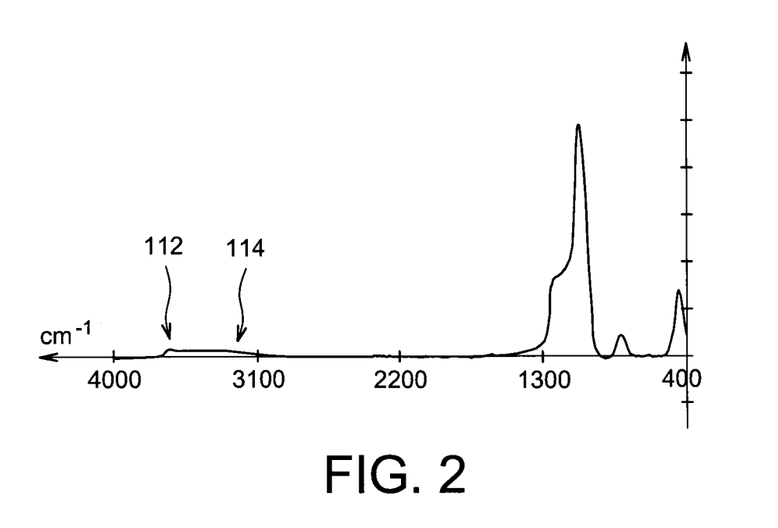
FIG. 2 shows the absorbance in the infrared band measured by transmission mode FTIR spectroscopy of a first layer of silicon oxide made during a direct bonding method, object of the present invention, according to a particular embodiment.

FIG. 2 shows the absorbance obtained in the infrared band of vibration frequencies between 400 and 4000 cm$^{-1}$, corresponding to the wavelengths between 2.5 and 25 µm, through transmission mode FTIR spectroscopy measured for the first layer of silicon oxide 104 deposited with the P5000B reactor at a power of 450 W. The measurement of this spectrum is for example made in the centre of the sample. From this absorbance measured (expressed in arbitrary units), it is possible to deduce therefrom the rate, or density, of the isolated silanol bonds present in the layer of silicon oxide by measuring the peak value (referenced 112 in FIG. 2) at 3660 cm$^{-1}$ because this value is representative of the value of the density of silanol bonds multiplied by the thickness of the layer. Furthermore, the non-zero value of the absorbance in the range 3200-3600 cm$^{-1}$ (referenced 114 in FIG. 2) reflects the presence of gathered silanol bonds in the layer of silicon oxide.

To improve the bonding quality of the first layer of silicon oxide 104, it is advisable to lower, upon making the first layer 104, the RF power of the reactor used for the deposition in order, when the absorbance of the oxide deposited is measured, for this to include, at a vibration frequency equal to about 3660 cm$^{-1}$, a peak of a value (or maximum value) equal to or higher than about $1.5 \times 10^{-5}$ nm$^{-1}$ (absorbance measured relative to the thickness of the layer of silicon oxide deposited).

In the case of layer of stoichiometric SiO$_2$ which are deposited under standard deposition conditions (strong RF power of the reactor used), the spectrum value in the range 3000-3800 cm$^{-1}$ is zero or almost zero.

Given that the Fourier Transform Spectrometer measures the absorbance of the layer of silicon oxide arranged onto a substrate, the data measured correspond to the absorbance of the full structure through which the light source of the measurement equipment passes, that is both the absorbance of the first layer of silicon oxide 104 and that of the first substrate 102. The spectrometer herein used is a Q5500 type BIORAD spectrometer marketed by Accent Optical Technologies. The curve 116 shown in FIG. 3 corresponds to the absorbance measured and output by the spectrometer. The absorbance of the first layer of silicon oxide 104 alone is obtained by subtracting from the absorbance of the full structure that of the first substrate 102 which can be measured beforehand upon depositing the first layer of silicon oxide 104 (refer to curve 118 shown in FIG. 2). This subtraction is for example performed by a processing software such as Win-IR Pro from Bio-Rad company. The absorbance of the environment wherein the full structure is located can be automatically subtracted by the spectrometer.

Figure 3:
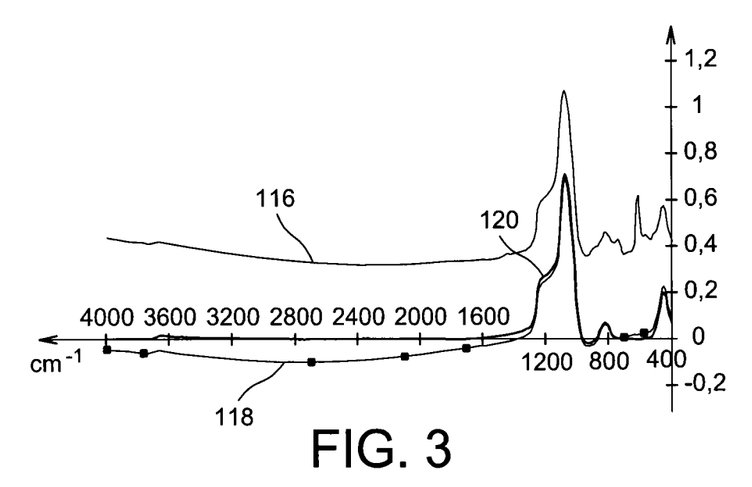
FIG. 3 shows different operations made upon measuring the absorbance in the infrared band by transmission mode FTIR spectroscopy of a first layer of silicon oxide made during a direct bonding method, object of the present invention, according to a particular embodiment.

The curve 118 is then linearized in order to correct the offsets and other parasitic phenomena occurring in the measurement. Indeed, the absorbance spectrum obtained after subtracting the absorbance from the substrate has negative values which are not consistent given that the sample does not emit light. A linearization is thus performed by offsetting some spectrum points on the abscissa axis corresponding to a zero absorbance value. In the present case where the value of the absorbance peak at 3660 cm$^{-1}$ is desired to be measured, and in order to be able to compare the absorbance spectra of several layers of silicon oxide between each other, each spectrum is linearized by offsetting the same points on the abscissa axis, for example those corresponding to the vibration frequencies equal to 4000 cm$^{-1}$, 3800 cm$^{-1}$, 2700 cm$^{-1}$, 1700 cm$^{-1}$, 700 cm$^{-1}$ and 570 cm$^{-1}$. After linearization, the curve 120 shown in FIG. 3 is thus obtained which corresponds to that shown in FIG. 2, from which it is possible to assess the density, or rate, of the silanol bonds present in the layer of silicon oxide.

In the bonding method described in connection with FIGS. 1A to 1C, the layers of silicon oxide 104 and 108 are directly deposited onto the silicon substrates 102 and 110. In this case, it is suitable not to exceed too high an amount of silanol bonds in these layers in order to avoid the subsequent formation of defects at the interface between the first layer 104 and the first substrate 102 (and possibly at the interface between the second layer 108 and the second substrate 110 if the second layer 108 includes silanol bonds) upon implementing the heat treatment performed after contacting both layers of silicon oxide 104 and 108 against each other. Thus, in order to increase the bonding energy of a layer of silicon oxide while avoiding the subsequent formation of defects at its interface with the substrate, it is advisable to select a RF power of the reactor used for depositing the first layer of silicon oxide 104 such that the absorbance of this layer of silicon oxide has a peak, at a vibration frequency equal to about 3600 cm$^{-1}$, of a value between about $1.5 \times 10^{-5}$ nm$^{-1}$ and $2 \times 10^{-5}$ nm$^{-1}$.

In the example previously described, the first layer of silicon oxide 104 is directly deposited onto the first silicon substrate 102.

In this case, it is ensured that the density of silanol bonds in the first layer of silicon oxide 104 is such that the absorbance peak at about 3660 cm$^{-1}$ does not exceed $2 \times 10^{-5}$ nm$^{-1}$ in order to avoid the formation of defects at the oxide/substrate interface.

It is however possible that the first layer of silicon oxide is not directly made on the first substrate, but on a barrier layer already present in the first substrate.

Figure 4:
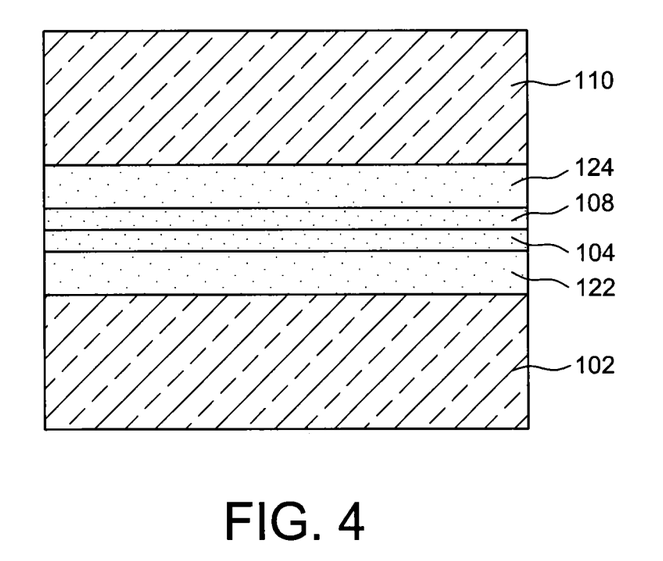
FIG. 4 shows the structure obtained after implementing a direct bonding method between a first layer of silicon oxide and a second layer, object of the present invention, according to a particular embodiment.

Such a configuration is shown in FIG. 4. In this example, the first layer of silicon oxide 104 is deposited on a first barrier layer 122 covering the first substrate 102. This first barrier layer 122 comprises for example Si$_3$N$_4$ and has a thickness for example equal to about 15 nm. This first barrier layer 122 could also comprise metal or a thermal oxide having a thickness equal to about 50 nm, or even comprises TEOS and having a thickness equal to about 200 nm, or even comprises any material able to form a barrier, that is to block the diffusion of silanol bonds from the oxide to the first substrate 102, and thereby to insulate the first layer of silicon oxide 104 from the first substrate 102.

In this alternative, the density of silanol bonds in the first layer 104 will advantageously be such that the absorbance peak at about 3600 cm$^{-1}$ is higher than about $2 \times 10^{-5}$ nm$^{-1}$ in order to increase the bonding energy, the presence of the first barrier layer 122 preventing defects from being formed at the interface between the first layer of oxide 104 and the first substrate 102, and enabling elements released upon bonding and which are likely to create defects, to be absorbed. Such a barrier layer 122 can be already present on the first substrate 102 or be for example made by PECVD in a standard way. In the example shown in FIG. 4, the first layer of oxide 104 is secured to the second layer of silicon oxide 108 which is also made on a second barrier layer 124 provided on the second substrate 110, enabling the number of silanol bonds to be increased in the second layer of silicon oxide 108 without the risk of forming defects between the second layer of silicon oxide 108 and the second substrate 110.

In the previously described examples, a density of silanol bonds such that the absorbance peak at about 3600 cm$^{-1}$ is higher than $1.5 \times 10^{-5}$ nm$^{-1}$ in a layer of silicon oxide is achieved by lowering the RF power of the depositing reactor used relative to that of a standard deposition of a stoichiometric SiO$_2$. Alternatively, such a density of silanol bonds can be achieved by changing the ratios of precursor gases used upon depositing the layer of silicon oxide, for example by increasing the ratio of the gas precursor comprising silicon to that comprising oxygen. For example, for a standard TEOS PECVD oxide deposition with a P5000B reactor at a power of 750 W, this ratio will be 1000 sccm ("standard cubic centimetres per minute"), that is a cubic centimetre per minute at a temperature of 0° C. and a pressure of 101.325 kPa) of O$_2$ and 1000 mgm (milligrams) of TEOS. To achieve a density of silanol bonds in a layer of silicon oxide such that the absorbance peak at about 3660 cm$^{-1}$ is higher than $1.5 \times 10^{-5}$ nm$^{-1}$, this ratio can for example be 300 sccm of O$_2$ and 1000 mgm of TEOS for a power of 750 W, enabling a 3 0 layer of silicon oxide having a tensile stress in the order of 50 MPa to be obtained. Such a tensile stress could be obtained by not changing the ratio of the gas precursors but by lowering the power of the P5000B reactor at about 500 W. With the P5000C reactor, a standard oxide can be obtained with a ratio of 600 sccm of O$_2$, 800 sccm of He, of TEOS and a power of 650 W. Such a layer has a compressive stress about −50 MPa and −150 MPa.

By lowering the amount of O$_2$ to 300 sccm without changing the other parameters, or by lowering the power to 550 W without changing the precursor ratio, a layer having a tensile stress in the order of 50 MPa is obtained. Furthermore, as previously, when the layer of silicon oxide is directly deposited onto a silicon substrate, it is advisable not to exceed too high an amount of silanol bonds, that is such that the absorbance of the layer of silicon oxide has a peak at a vibration frequency equal to about 3660 cm$^{-1}$, of a value between about $1.5 \times 10^{-5}$ nm$^{-1}$ and $2 \times 10^{-5}$ nm$^{-1}$, in order to avoid the formation of defects between the layer of silicon oxide and the substrate.

It is also possible to modulate these two parameters (RF power of the reactor used for deposition and ratio of precursor gas) to obtain the desired amount of silanol bonds in the deposited layer of silicon oxide.

In order to increase the bonding energy of the layer of silicon oxide, it is also possible to create silanol bonds in an existing layer of silicon oxide. For this, after the layer of silicon oxide (in a stoichiometric form or not) has been deposited, a step of hydrolization of the layer of silicon oxide is carried out, for example by storing this layer (with the substrate on which the layer is deposited) in an environment having a non-zero moisture rate or even by dipping the layer of silicon oxide into water or more generally an aqueous medium, thereby forming silanol bonds in the silicon oxide, from the layer surface down to a depth equal to or higher than about 10 nm. This hydrolyzation step can also be implemented for a layer of silicon oxide already including silanol bonds, that is deposited with a reactor operating at a low RF power and/or with an adjusted ratio of precursor gases, as previously described.

However, when it is advisable not to exceed a certain density of silanol bonds in the layer of silicon oxide and when the layer already includes a density of silanol bonds close to the limit density (for example close to the limit of $2 \times 10^{-5}$ nm$^{-1}$ when the oxide is directly deposited onto the silicon substrate), and in order to prevent the density of silanol bonds to be further increased in the layer of silicon oxide because of the storage of the layer in a moist environment, the layer of silicon oxide can be stored in a nitrogen controlled atmosphere, which enables a moisture absorbance by the layer of silicon oxide to be avoided.

Upon making the layer(s) of silicon oxide including silanol bonds, the techniques implemented (for example PECVD deposition or even hydrolyzation) enable oxygen and hydrogen to be diffused at a depth equal to or higher than about 10 nm, thus creating silanol bonds at such a depth in the layer(s) of silicon oxide.

The invention claimed is:

1. A method, comprising:
   directly bonding a first layer and a second layer;
   wherein the first layer comprises a silicon oxide having a thickness equal to or greater than 10 nm;
   wherein the second layer comprises a hydrophilic material;
   wherein, prior to the bonding, the first layer is disposed on a first substrate, the first layer comprises silanol bonds extending in at least one part from a surface of the first layer to a depth equal to or greater than about 10 nm, and the first layer has an absorbance value, at a vibration frequency of the silanol bonds to about 3660 cm$^{-1}$, of equal to or greater than about $1.5 \times 10^{-5}$ nm$^{-1}$.

2. The method of claim 1, wherein the first layer is obtained by a PECVD type deposition of silicon oxide onto the first substrate.

3. The method of claim 2, wherein the first layer is deposited such that it has a tensile stress equal to or higher than about 50 MPa after the deposition.

4. The method of claim 1, further comprising:
   prior to the bonding, depositing the silicon oxide onto the first substrate; and
   hydrolysing the deposited silicon oxide to form at least part of the silanol bonds present in the first layer.

5. The method of claim 1, further comprising:
   annealing the first layer and the second layer at a temperature equal to or lower than 400° C. for a period of time in the range of about 10 minutes and 10 hours that occurs after the direct bonding between the first layer and the second layer.

6. The method of claim 1, further comprising:
   chemical mechanical planarizing of the first layer and/or the second layer that occurs after making the first layer on the first substrate and after the direct bonding between the first layer and the second layer.

7. The method of claim 1, wherein:
   the first substrate comprises silicon, and the first absorbance value of the first layer is between about $1.5 \times 10^{-5}$ nm$^{-1}$ and $2 \times 10^{-5}$ nm$^{-1}$.

8. The method of claim 1, further comprising:
   depositing the first layer onto a barrier layer covering the first substrate;
   wherein the barrier layer comprises at least one material able to block diffusion of silanol bonds from the first layer to the first substrate;
   wherein the first layer has an absorbance value at a vibration frequency of the silanol bonds greater than about $2 \times 10^{-5}$ nm$^{-1}$.

9. The method of claim 1, wherein the second layer of material comprises silicon oxide and is made analogously to the first layer.

10. A method, comprising:
    directly bonding a first layer and a second layer;
    wherein the first layer comprises a silicon oxide having a thickness equal to or greater than 10 nm;
    wherein the second layer comprises a hydrophilic material;
    wherein, prior to the bonding, the first layer is disposed on a first substrate, the first layer comprises silanol bonds extending in at least one part from a surface of the first layer to a depth equal to or greater than about 10 nm, and the first layer has an absorbance value, at a vibration frequency of the silanol bonds to about 3660 cm$^{-1}$, of equal to or greater than about $1.5 \times 10^{-5}$ nm$^{-1}$,
    wherein the first layer comprises a non-stoichiometric silicon oxide obtained via a PECVD type deposition of silicon oxide onto the first substrate; wherein the PECVD type deposition is performed at a RF power lower than a RF power enabling silicon dioxide to be deposited in stoichiometric form, forming at least part of the silanol bonds present in the first layer.

11. A method, comprising:
    directly bonding a first layer and a second layer;
    wherein the first layer comprises a silicon oxide having a thickness equal to or greater than 10 nm;
    wherein the second layer comprises a hydrophilic material;
    wherein, prior to the bonding, the first layer is disposed on a first substrate, the first layer comprises silanol bonds extending in at least one part from a surface of the first layer to a depth equal to or greater than about 10 nm, and the first layer has an absorbance value, at a vibration frequency of the silanol bonds to about 3660 cm$^{-1}$, of equal to or greater than about $1.5 \times 10^{-5}$ nm$^{-1}$,
    wherein the first layer comprises non-stoichiometric silicon oxide obtained via a PECVD type deposition of silicon oxide onto the first substrate; wherein the PEVCD type deposition is performed with gas precursors of a first type and oxidizing gas precursors the ratio of which is higher than that enabling silicon dioxide to be deposited in stoichiometric form, forming at least part of the silanol bonds present in the first layer.

* * * * *